(12) United States Patent
Abraham et al.

(10) Patent No.: US 10,347,600 B2
(45) Date of Patent: Jul. 9, 2019

(54) THROUGH-SUBSTRATE-VIAS WITH SELF-ALIGNED SOLDER BUMPS

(71) Applicant: INTERNATIONAL BUSINESS MACHINES CORPORATION, Armonk, NY (US)

(72) Inventors: David W. Abraham, Croton, NY (US); John M. Cotte, New Fairfield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/813,222

(22) Filed: Nov. 15, 2017

(65) Prior Publication Data

US 2018/0331058 A1    Nov. 15, 2018

Related U.S. Application Data

(63) Continuation of application No. 15/590,547, filed on May 9, 2017.

(51) Int. Cl.
*H01L 23/00* (2006.01)
*H01L 23/522* (2006.01)
(Continued)

(52) U.S. Cl.
CPC ........ *H01L 24/11* (2013.01); *H01L 21/76898* (2013.01); *H01L 23/5226* (2013.01); *H01L 24/13* (2013.01); *H01L 24/14* (2013.01); *H01L 24/24* (2013.01); *H01L 24/27* (2013.01); *H01L 24/32* (2013.01); *H01L 24/73* (2013.01); *H01L 24/82* (2013.01); *H01L 24/92* (2013.01); *H01L 27/18* (2013.01); *H01L 39/00* (2013.01); *H01L 24/03* (2013.01); *H01L 24/05* (2013.01); *H01L 24/25* (2013.01); *H01L 24/29* (2013.01); *H01L 24/83* (2013.01); *H01L 2224/0345* (2013.01);
(Continued)

(58) Field of Classification Search
None
See application file for complete search history.

(56) References Cited

U.S. PATENT DOCUMENTS 5,225,372 A * 7/1993 Savkar ............... H01L 21/28512
  257/753
5,578,523 A * 11/1996 Fiordalice ......... H01L 21/76802
  257/E21.576
(Continued)

OTHER PUBLICATIONS

David W. Abraham, et al., Pending U.S. Appl. No. 15/590,547, entitled "Through-Substrate-Vias With Self-Aligned Solder Bumps," filed with the U.S. Patent and Trademark Office on May 9, 2017.
(Continued)

*Primary Examiner* — Bilkis Jahan
(74) *Attorney, Agent, or Firm* — Cantor Colburn LLP; Rabin Bhattacharya

(57) ABSTRACT

A semiconductor structure and methods of forming the semiconductor structure include a solder bump self-aligned to a through-substrate-via, wherein the solder bump and the through-substrate-via are formed of a conductive metal material, and wherein the through-substrate-via is coupled to a buried metallization layer, which is formed of a different conductive metal material.

11 Claims, 5 Drawing Sheets

(51) Int. Cl.
  *H01L 21/768* (2006.01)
  *H01L 27/18* (2006.01)
  *H01L 39/00* (2006.01)

(52) U.S. Cl.
  CPC *H01L 2224/0347* (2013.01); *H01L 2224/056* (2013.01); *H01L 2224/05022* (2013.01); *H01L 2224/05124* (2013.01); *H01L 2224/05558* (2013.01); *H01L 2224/05572* (2013.01); *H01L 2224/11005* (2013.01); *H01L 2224/1131* (2013.01); *H01L 2224/1147* (2013.01); *H01L 2224/11849* (2013.01); *H01L 2224/131* (2013.01); *H01L 2224/13009* (2013.01); *H01L 2224/13022* (2013.01); *H01L 2224/24011* (2013.01); *H01L 2224/24051* (2013.01); *H01L 2224/24105* (2013.01); *H01L 2224/24146* (2013.01); *H01L 2224/25175* (2013.01); *H01L 2224/275* (2013.01); *H01L 2224/29023* (2013.01); *H01L 2224/29124* (2013.01); *H01L 2224/32145* (2013.01); *H01L 2224/32221* (2013.01); *H01L 2224/73209* (2013.01); *H01L 2224/73217* (2013.01); *H01L 2224/73253* (2013.01); *H01L 2224/82031* (2013.01); *H01L 2224/82101* (2013.01); *H01L 2224/8382* (2013.01); *H01L 2224/83193* (2013.01); *H01L 2224/83203* (2013.01); *H01L 2224/9202* (2013.01); *H01L 2224/92144* (2013.01)

(56) References Cited

U.S. PATENT DOCUMENTS

| | | | | |
|---|---|---|---|---|
| 6,566,737 | B2* | 5/2003 | Bohr | H01L 21/02164 |
| | | | | 257/635 |
| 7,485,564 | B2* | 2/2009 | Daubenspeck | H01L 23/3192 |
| | | | | 257/E21.508 |
| 7,494,912 | B2* | 2/2009 | Coolbaugh | H01L 24/11 |
| | | | | 438/612 |
| 8,299,611 | B2* | 10/2012 | Arvin | H01L 24/03 |
| | | | | 257/38 |
| 2004/0223380 | A1* | 11/2004 | Hato | H01L 27/18 |
| | | | | 365/200 |
| 2012/0018874 | A1* | 1/2012 | Lin | H01L 21/561 |
| | | | | 257/734 |
| 2012/0025383 | A1* | 2/2012 | Daubenspeck | H01L 21/76852 |
| | | | | 257/762 |
| 2013/0049190 | A1* | 2/2013 | Topacio | H01L 24/05 |
| | | | | 257/737 |
| 2015/0076688 | A1* | 3/2015 | Daubenspeck | H01L 24/81 |
| | | | | 257/737 |

OTHER PUBLICATIONS

List of IBM Patents or Patent Applications Treated as Related; (Appendix P), Filed Nov. 15, 2017; 2 pages.

* cited by examiner

THROUGH-SUBSTRATE-VIAS WITH SELF-ALIGNED SOLDER BUMPS

DOMESTIC PRIORITY

This Application is a CONTINUATION of U.S. application Ser. No. 15/590,547, filed May 9, 2017, which is incorporated herein by reference in its entirety.

STATEMENT REGARDING FEDERALLY SPONSORED RESEARCH OR DEVELOPMENT

This invention was made with Government support under Contract No. H98230-13-D-0173 by the National Security Agency. The Government has certain rights to this invention.

BACKGROUND

The present invention generally relates to fabrication methods and resulting structures for semiconductor devices. More specifically, the present invention relates to the structure and simultaneous formation of through-substrate-vias (TSV) with self-aligned solder bumps.

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multilayered schemes, such as, for example, single or dual damascene wiring structures. A TSV is a vertical electrical connection (via) passing completely through a substrate such as a silicon wafer or die. TSVs are high performance interconnect techniques used as to carry signals through a substrate and to mitigate the effect of chip modes and prevent the appearance of slot-line modes. TSVs can be used to create 3D packages and 3D integrated circuits, compared to alternatives such as package-on-package, because the density of the vias is substantially higher, and because the length of the connections is shorter. Bump bonds generally begin as small spheres of solder that are bonded to contact areas or pads of semiconductor devices. Subsequently, the bump bonds are used for face-down bonding such as can occur in flip chip applications, which are also known as controlled collapse chip connection (C4). The bumps can then be reflowed to complete the interconnect. The bump serves to both mechanically attach the two chips as well as form an electrical connection between elements on both chips, or between grounded portions of the circuitry.

SUMMARY

The present invention is generally directed to semiconductor structures and methods for forming the semiconductor structures. In one or more embodiments, a method of fabricating a semiconductor device includes providing a base substrate, a carrier substrate, and a buried metallization layer intermediate the base substrate and the carrier substrate, and a top metallization layer of a first conductive metal material on a top surface of the carrier substrate. Unfilled through-substrate-vias are formed in the carrier substrate to the buried metallization layer. An under bump metallization layer of a second conductive metal material is formed on surfaces defining the unfilled through-substrate-vias, a perimeter surrounding the unfilled through-substrate-vias on the carrier substrate, and on the first conductive metal material layer, wherein the under bump metallization layer is coupled to the buried metallization layer and the top metallization layer. The first and second conductive metal materials are different. A sacrificial layer is deposited and patterned to form openings exposing the unfilled through-substrate-vias and the perimeter surrounding the unfilled through-substrate-vias on the carrier substrate and on the top metallization layer. The openings are filled with a third conductive metal material and the sacrificial layer is removed to form a cylindrical shaped solder bump self-aligned to a filled through-substrate-via.

In one or more embodiments, a method of fabricating a semiconductor device includes providing a base substrate including a first metallization layer, a polysilicon or dielectric layer on the first metallization layer, and a second metallization layer on the polysilicon or the dielectric layer. The second metallization layer is patterned to form openings to the polysilicon or dielectric layer. Vias are formed in the openings through the polysilicon or dielectric layer to the first metallization layer to form through-substrate-vias. An under bump metallization layer is formed on surfaces defining the unfilled through-substrate-vias, a perimeter surrounding the unfilled through-substrate-vias on the polysilicon or dielectric layer, and on the second metallization layer, wherein the under bump metallization layer is coupled to the first and second metallization layers. A sacrificial layer is deposited and patterned to form openings exposing the through-substrate-vias, the perimeter surrounding the vias on the polysilicon or dielectric layers, and on the second metallization layer. The openings are filled with a conductive metal material, and the sacrificial layer is removed to form cylindrical shaped solder bumps self-aligned to the through-substrate-vias.

In one or more embodiments, a semiconductor structure includes a solder bump self-aligned to a through-substrate-via, wherein the solder bump and the through substrate via are formed of a first superconducting metal, and wherein the through-substrate-via is coupled to a buried metallization layer.

In one or more other embodiments, a semiconductor structure includes a first silicon substrate, a second silicon substrate, and at least one buried ground plane intermediate the first and second silicon substrates. The second substrate includes a through-silicon-via extending from a first surface located on one side of the second substrate to the at least one buried ground plane on an opposite side of the second substrate, wherein the buried ground plane is formed of a first conductive metal material. A top layer formed of a second conductive metal material is on the first surface. A conformal under bump metallization layer formed of a third conductive metal material in the through-substrate-via is in contact with the buried ground plane, a perimeter about the through-substrate-via on the second substrate, and a perimeter about the through-substrate via on the top layer. A solder bump is self-aligned to the through-substrate-via, wherein the solder bump and the through-substrate-via includes a fourth conductive metal material.

In still other embodiments, a semiconductor structure includes a first silicon substrate. A first metallization layer is formed of a first conductive metal material on the first silicon substrate. A polysilicon layer or a dielectric layer is on the first metallization layer. A second first metallization layer formed of a second conductive metal material is on the polysilicon layer or the dielectric layer. A through-substrate-via extends through the polysilicon layer or the dielectric layer. A conformal under bump metallization layer formed of a third conductive metal material is in the throughsubstrate-via and in contact with the first metallization layer, a perimeter about the through-substrate-via on the polysilicon layer or the dielectric layer, and a perimeter about the through-substrate-via on the second metallization layer. A solder bump is self-aligned to the through-substrate-via, wherein the solder bump and the through-substrate-via include a fourth conductive metal material.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
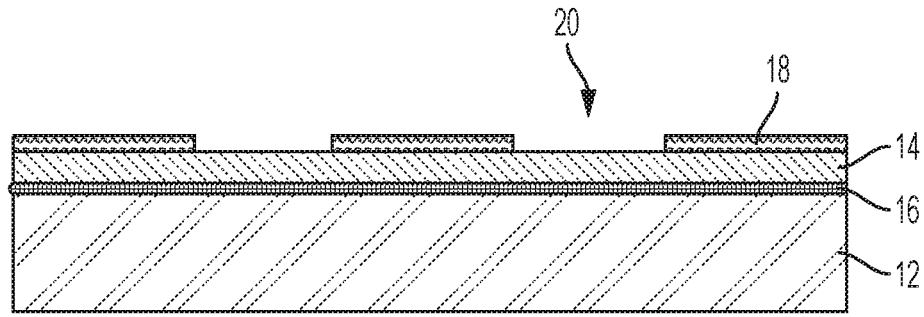
FIG. 1 is a sectional view depicting a semiconductor device after a fabrication operation according to embodiments of the invention.

Exemplary embodiments of the invention will now be discussed in further detail with regard to semiconductor devices and methods of manufacturing the same and, in particular, to a structure including a combined superconducting through-substrate-via integrated with a solder bump and methods of fabricating the same utilizing an injection molded soldering process (IMS) to form both the superconducting via and the solder bump.

Electronic chip assemblies require use of both vias to control chip modes and bump bonds for carrying signals between chips. The present invention overcomes these problems and is generally directed to integrated formation of both the through-substrate-vias and the bumps on a base wafer, which are self-aligned to the through-substrate-vias.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps could have been utilized to form regions or junctions in the base semiconductor structure or foundation.

The term "under bump metal (UBM) "or" under bump metallization (UBM)" as used herein refers to a layer utilized in a solder bump structure to provide an adhesion/diffusion barrier layer, a solder wettable layer, and an oxidation barrier layer between the bonding pads of the die and the bumps. In one or more embodiments, a UBM uses multiple different metal layers, such as an adhesion layer, a diffusion barrier layer, a solderable layer, and an oxidation barrier layer. It is further possible that the UBM layers are compatible metals, which in combination have low internal mechanical stresses.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular. Thus, for example, reference to a problem-solving system including "a solder bump" includes a single solder bump, or two or more solder bumps. It should also be noted that the term "or" is generally employed in its sense including "and/or" unless the content clearly dictates otherwise.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

Turning now to FIGS. 1-6, there is shown a method in accordance with one or more embodiments of fabricating a combined through-substrate-via integrated with a self-aligned solder bump utilizing an injection molded soldering process (IMS) to simultaneously form both the via and the bump, wherein the bump is self-aligned to the via.

In FIG. 1, the initial structure 10 includes a base substrate 12, a thinned carrier substrate 14 bonded to the base substrate 12, and a buried ground plane 16 intermediate the carrier substrate 14 and the base substrate 12. A bonding agent can be used to bond the carrier substrate to the base substrate. By way of example, the bonding agent can be applied to the ground plane layer formed on a bottom surface of the carrier substrate and then bonded to the base substrate. A relatively thin layer of a conductive metal material 18 (i.e., top metallization layer) is deposited and patterned on a top surface of the initial structure to form openings 20.

The base substrate 12 can be a silicon wafer or a semiconductor chip/die. The material of the semiconductor wafer or chip/die is not limited to specific types. The base substrate 12 can include a plurality of wiring layers (including devices such as a transistor) and insulating layers. The base substrate 12 can be formed by the lamination of a plurality of semiconductor substrates.

In one or more embodiments, the base substrate 12 includes a thin layer of metal conductive material thereon, which can be used to form the buried ground plane 16 and also bond with a similarly patterned metal conductive material layer formed on the carrier substrate 14. In these embodiments, the carrier substrate 14 can be bonded to the base substrate 12 by thermocompression bonding, for example, which is also referred to as diffusion bonding. In the event the thin layers of metal conductive materials are patterned prior to bonding, the portions of the conductive metal on the carrier substrate 14 are mated to the corresponding patterned metal conductive material on the base substrate 12. In this manner, the thin layer of metals on each substrate 12, 14 can be brought together into atomic contact by applying force and heat simultaneously to bond the cap substrate 14 to the base substrate 12. The resulting buried ground plane structure 16 includes the thin metal layer from the base substrate 12 and the thin superconducting layer from the carrier substrate 14.

As an example of thermocompression bonding, aluminum on the base substrate can be bonded to aluminum on the carrier substrate by subjecting the substrates to a bonding temperature from about 400° C. to about 450° C. with an applied force above 70 kN for 20 to 45 min, although higher or lower temperatures and forces can be used for different superconducting metals.

Once bonded, the resulting buried ground plane 16 formed of conductive metal material can have a thickness of about 10 nanometers (nm) to about 10 micrometers (μm). In one or more embodiments, the superconducting metal is deposited at a thickness of about 100 nm to about 5 μm, and in still other embodiments, the conductive metal materials deposited at a thickness of about 100 nm to about 300 nm.

Subsequent to bonding, the carrier substrate 14 can be thinned by a wafer back grinding process to remove a portion thereof and provide a desired thickness intended for the application. Alternatively, the carrier substrate 14 can be thinned prior to bonding. The thickness of carrier substrate defines the length of the through-substrate-via, which is generally configured along with the via diameter to provide an aspect ratio of less than 10. In one or more embodiments, the aspect ratio is less than 5, and in still other embodiments the aspect ratio is less than 3.

Subsequent to bonding of the carrier substrate 14 to the base substrate 12, the layer of conductive metal material 18 is deposited onto an exposed top surface of the carrier substrate 14 and lithographically patterned to form openings 20 therein, which can include forming a photoresist (organic, inorganic or hybrid) atop the layer of the conductive metal material 18. The photoresist can be formed utilizing a deposition process such as, for example, CVD, PECVD and spin-on coating. Following formation of the photoresist, the photoresist is exposed to a desired pattern of radiation. Next, the exposed photoresist is developed utilizing a conventional resist development process. After the development step, a selective etching step can be performed to transfer the openings 20 from the patterned photoresist into the layer of conductive metal 18 stopping at the carrier substrate 14, i.e., stopping at the silicon layer. The etching step used in forming the openings 20 in the layer of conductive metal material 18 can include a dry etching process (including, for example, reactive ion etching, ion beam etching, plasma etching or laser ablation), a wet chemical etching process or any combination thereof.

Figure 2:
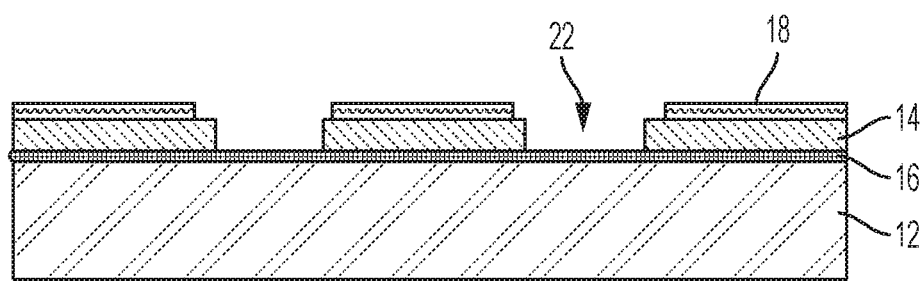
FIG. 2 is a sectional view depicting a semiconductor device after a fabrication operation according to embodiments of the invention.

In FIG. 2, the openings 20 in the conductive metal layer 18 are transferred into the carrier substrate 14 to define via openings 22 in the carrier substrate 14 for forming the through-substrate-vias and self-aligned solder bumps. Transfer can be effected by anisotropically etching the carrier substrate 14, i.e., silicon, to the buried ground plane 16.

Figure 3:
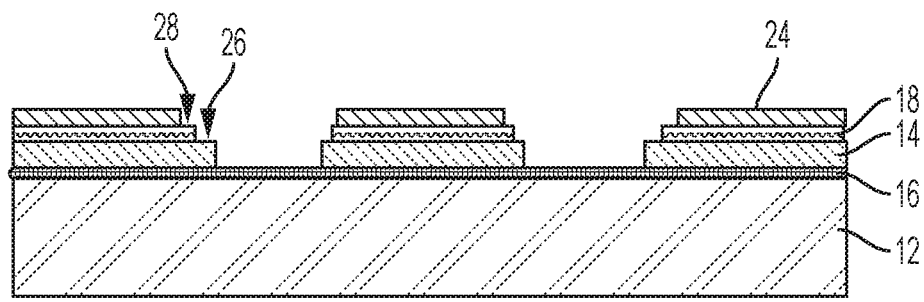
FIG. 3 is a sectional view depicting a semiconductor device after a fabrication operation according to embodiments of the invention.

In FIG. 3, a sacrificial layer 24 such as a dry photoresist can be laminated and patterned to expose the through substrate via openings 22 and the edges 26, 28 of the carrier substrate 14 and metallization layer 18, respectively, as shown. The thickness of the sacrificial photoresist film can be from 15 μm to 200 μm microns. In one or more other embodiments, the thickness can be from 25 microns to 150 microns, and in still other embodiments the thickness can be from 25 to 100 microns.

In one or more embodiments, the sacrificial layer 24 can be a bilayer photoresist, wherein the lower layer is configured to develop an undercut to allow for selective lift off of a subsequently deposited blanket layer of a superconducting metal. Lift off is generally known as an additive process that can be used to remove unwanted metallization as opposed to etching, which is a subtractive process. The bilayer includes deposition of a first layer that is not photosensitive followed by deposition of a second layer of the photoresist. Because of the chemical differences between the first layer and the photoresist, there is no intermixing during deposition of the photoresist onto the first layer. After imaging the photoresist, the first layer and the photoresist are developed at the same time, wherein the first layer is selected to be freely soluble in the photoresist developer. Once the photoresist is fully developed and the dissolution of the photoresist stops, the developer continues to dissolve away the first layer in the open areas. By slightly increasing the standard photoresist developer time, the developer dissolution rate proceeds isotropically, but can be very tightly controlled to "cut under" the edge of the resist profile, i.e., provide an undercut. Because of the undercut, solvent can easily penetrate and lift-off the first layer and the metal deposited thereon.

Figure 4:
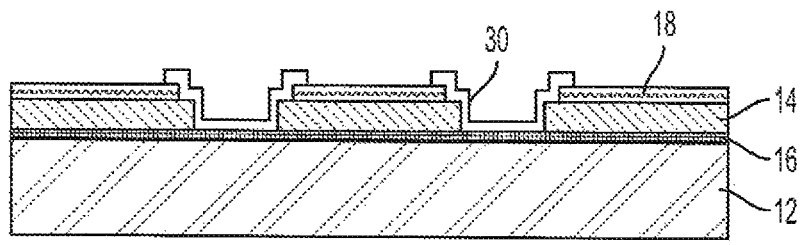
FIG. 4 is a sectional view depicting a semiconductor device after a fabrication operation according to embodiments of the invention.

As shown in FIG. 4, a conductive metal material for forming the under bump metallization 30 is then blanket deposited onto the patterned carrier substrate 14 and the sacrificial photoresist material is subsequently removed, leaving behind only the conductive metal material deposited directly onto the carrier substrate 14, i.e., the via openings 22 and the edges 26, 28 of the carrier substrate 14 and metallization layer 18, respectively, as shown.

Figure 5:
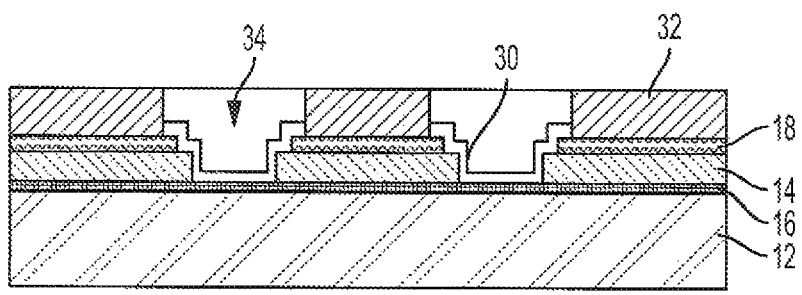
FIG. 5 is a sectional view depicting a semiconductor device after a fabrication operation according to embodiments of the invention.

In FIG. 5, a sacrificial layer 32 such as a dry photoresist film 32 is deposited and patterned to expose the under bump metallization 30. The openings in the patterned photoresist film 32 are then filled with a conductive metal material 34 by an injection molded soldering (IMS) process. The IMS process can be used to simultaneously provide the controlled filling of the through-substrate-vias and the self-aligned bump with molten solder or solder alloys of any composition. It is accomplished by using an IMS head where the solder is loaded and melted first and then placed tightly against a substrate surface and glided across the surface. A vacuum channel is provided ahead of the solder slot such that the vias and cavities defining the bump are under vacuum. Molten solder then runs quickly into the cavities and vias that are under vacuum and filling the vias and cavities. After the openings in the patterned sacrificial layer 32 are filled with the conductive metal material 34 and cooled, the sacrificial layer 32 can be removed. The resulting conductive metal material can be used as is, e.g., cylindrical shape or reflowed to provide a hemispherical shape for subsequent bonding to another chip, interposer, substrate or the like.

The conductive metal materials such as copper, gold and the like where indicated, can be deposited without previous treatment by evaporation, sputtering or by electroplating. The conductive metal material can be the same or different in each instance where a metal is indicated. In one or more embodiments, the conductive metal material is a superconducting metal. Suitable superconducting metals utilized herein are not intended to be limited and can include aluminum, carbon, gallium, hafnium, indium, iridium, lanthanide, molybdenum, niobium, rhenium, ruthenium, tin, tantalum, titanium, tungsten, vanadium, zinc, zirconium, alloys thereof, and the like.

Most solder metals are alloys, or combinations of pure elements or materials. Alloys have very different melting characteristics compared to their pure metal forms. Most alloys do not have a single melting temperature or melting point; instead they have a melting range. The upper and lower limits of this range are called the liquidus and solidus temperatures, respectively. The solder begins to melt at its solidus temperature and continues to melt until it reaches the liquidus temperature, where it is completely molten. The difference between the solidus and liquidus temperatures is referred to as the gap. Some solder alloys have a large gap, whereas others have a small or virtually non-existent gap. With a large gap, the application of solder bumps directly to the IMS column is feasible because the amount of reflow is easily controlled. If a solder alloy with a small or non-existent gap is used, controlling the amount of reflow can be difficult. The present invention can accomplish the desired result with a wide variety of solder alloys.

Figure 6:
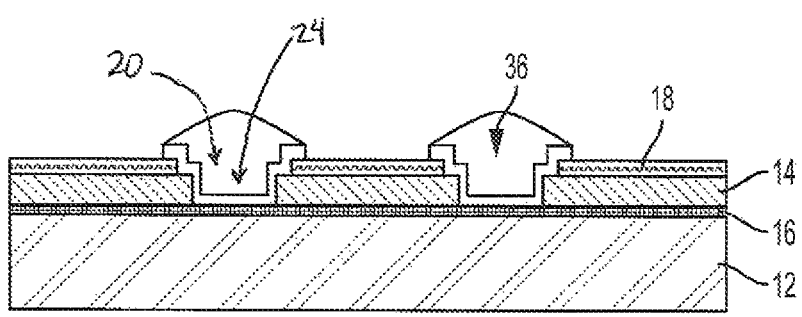
FIG. 6 is a sectional view depicting a semiconductor device after a fabrication operation according to embodiments of the invention.

In FIG. 6, the IMS deposited solder can then be subjected to a reflow process to form solder bumps as shown, which are self-aligned to the filled vias and electrically coupled to the buried metallization layer. The height of the solder bump at its apex can approximate the thickness of the sacrificial dry photoresist 32 used during the IMS processing. Moreover, the solder bumps are of uniform height. The illustrated solder bump is a small sphere/hemisphere of solder that can be used for establishing a "bond" (i.e., an electrical connection) between two electrical current paths (e.g., between an electrical device and the UBM).

Figure 7:
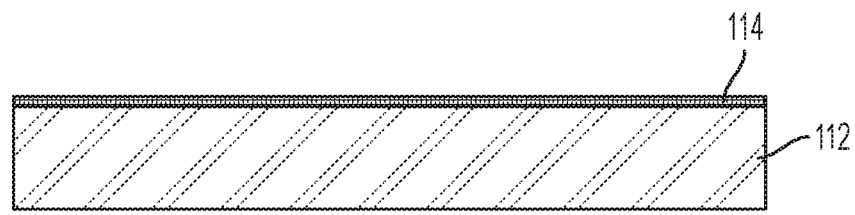
FIG. 7 is a sectional view depicting a semiconductor device after a fabrication operation according to embodiments of the invention.

In one or more other embodiments, the fabrication of the combined metal filled self-aligned bump and through-substrate-vias is in accordance with that generally shown in FIGS. 7-12. In FIG. 7, a ground plane 114 is formed on a base substrate 112. The base substrate 112 can be a silicon wafer or a semiconductor chip/die as previously described. The ground plane layer 114 is formed of a conductive metal material, which can be patterned as desired for different applications to form multiple ground planes.

Figure 8:
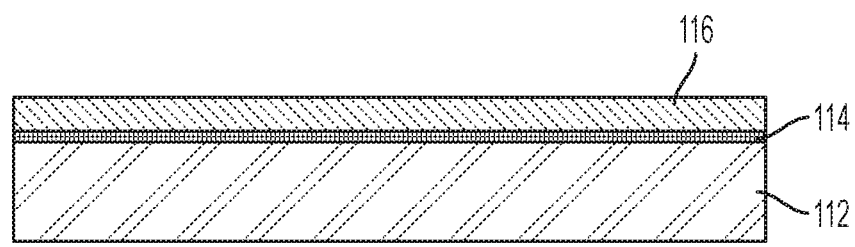
FIG. 8 is a sectional view depicting a semiconductor device after a fabrication operation according to embodiments of the invention.

In FIG. 8, a polysilicon layer or dielectric layer 116 is deposited onto the ground plane 114. The polysilicon or dielectric layers 116 can be deposited by, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), or other suitable processes. The thickness of layer 116 defines the length of the through-substrate-via, which is generally configured along with the via diameter to provide an aspect ratio of less than 10. In one or more embodiments, the aspect ratio is less than 5, and in still other embodiments the aspect ratio is less than 3.

Figure 9:
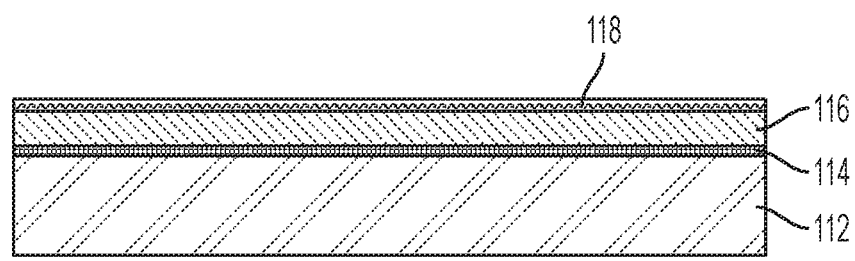
FIG. 9 is a sectional view depicting a semiconductor device after a fabrication operation according to embodiments of the invention.

In FIG. 9, the top surface of layer 116 is metallized by deposition of a conductive metal material layer 118 thereon. In one or more embodiments, the thickness of the conductive metal material layer can be 100 nm to 2000 nm. The conductive metal material is not intended to be limited and can include superconducting metals and alloys thereof.

Figure 10:
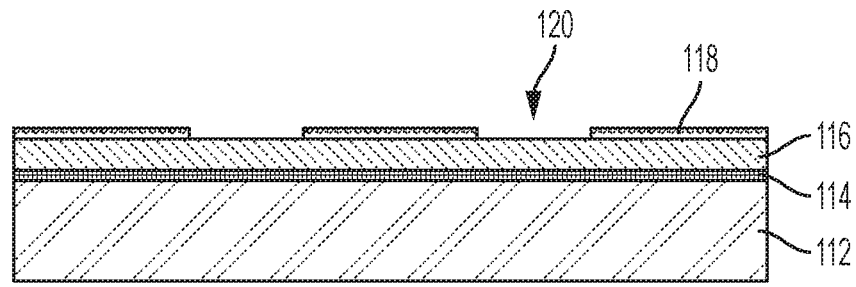
FIG. 10 is a sectional view depicting a semiconductor device after a fabrication operation according to embodiments of the invention.

In FIG. 10, the conductive metal material layer 118 is lithographically patterned and etched. The photolithography process can include, for example, introducing electromagnetic radiation such as ultraviolet light through an overlay mask to cure a photoresist material (not shown). Depending upon whether the resist is positive or negative, uncured portions of the resist are removed to form the first resist pattern including openings to expose portions of the conductive metal layer, which can then be etched to form openings 120 within the conductive metal material layer 118, thereby exposing portions of the underlying layer 116. The material defining photoresist can be any appropriate type of photoresist materials, which can partly depend upon the device patterns to be formed and the exposure method used. For example, material of photo-resist layer can include a single exposure resist suitable for, for example, argon fluoride (ArF); a double exposure resist suitable for, for example, thermal cure system; and/or an extreme ultraviolet (EUV) resist suitable for, for example, an optical process.

Figure 11:
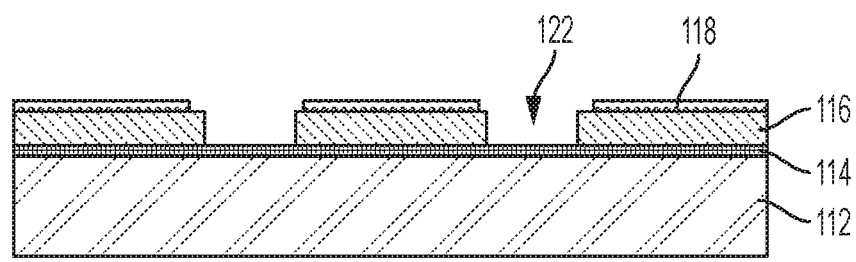
FIG. 11 is a sectional view depicting a semiconductor device after a fabrication operation according to embodiments of the invention.

In FIG. 11, the openings 120 in the conductive metal material layer 18 are transferred into layer 116 to define through substrate via openings 122 in the polysilicon or dielectric layer 116. Transfer can be effected by anisotropically etching layer 116 to the buried ground plane 16.

Figure 12:
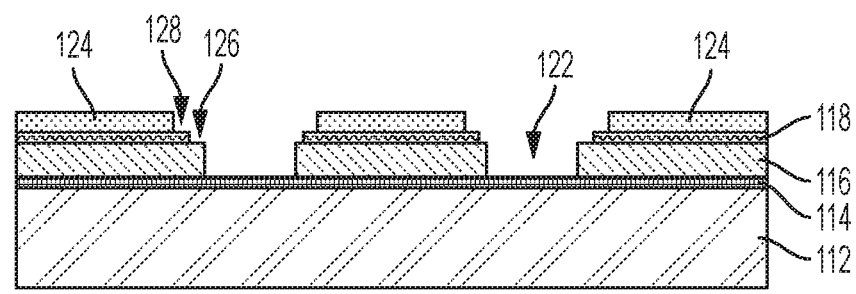
FIG. 12 is a sectional view depicting a semiconductor device after a fabrication operation according to embodiments of the invention.

In FIG. 12, a sacrificial layer 124 is deposited and patterned so as to expose the edges 126, 128 of layer 116 and the metallization layer 118, respectively, as shown. By way of example, the sacrificial layer can be a single layer of photoresist. In one or more other embodiments, the sacrificial layer 124 can be a bilayer photoresist as previously described.

Figure 13:
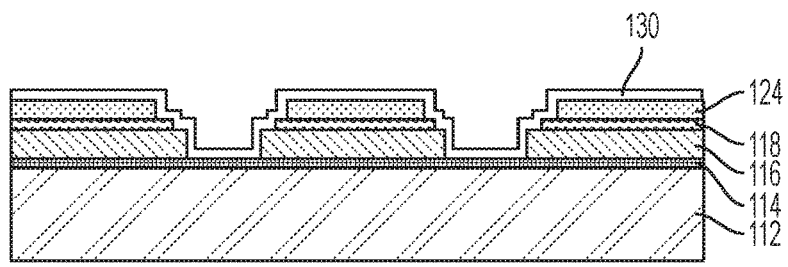
FIG. 13 is a sectional view depicting a semiconductor device after a fabrication operation according to embodiments of the invention.

In FIG. 13, a conformal metal layer 130 is deposited onto the substrate. The conformal metal layer can be sputter deposited so as to provide sidewall coverage within the via 122. The photoresist layer 124 is removed along with portions of the metal layer thereon to form under bump metallization. For example, a lift-off process can be used as previously described.

Figure 14:
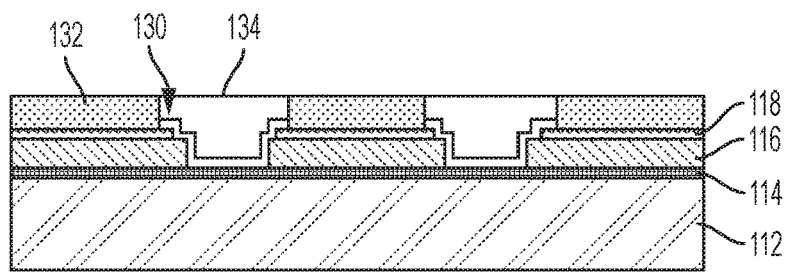
FIG. 14 is a sectional view depicting a semiconductor device after a fabrication operation according to embodiments of the invention.

In FIG. 14, a sacrificial layer 132 such as a dry photoresist film is deposited and patterned to expose the under bump metallization 130. The openings in the sacrificial layer 132 are then filled with a conductive metal material 134 by an injection molded soldering (IMS) process, which provides the controlled filling of the through-substrate-vias and the self-aligned bump with molten solder or solder alloys of any composition as previously described.

Figure 15:
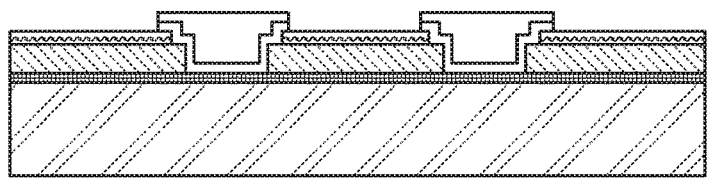
FIG. 15 is a sectional view depicting a semiconductor device after a fabrication operation according to embodiments of the invention.

In FIG. 15, after the openings in the patterned photoresist 32 are filled with the superconducting metal material 343 and cooled, the photoresist film 132 can be removed.

Figure 16:
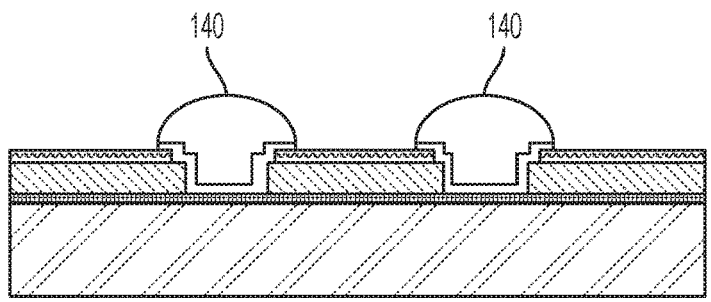
FIG. 16 is a sectional view depicting a semiconductor device after a fabrication operation according to embodiments of the invention.

In FIG. 16, the structure is subjected to an optional reflow process as previously described to form solder bumps 140 (or used as is having a cylindrical shape) that are self-aligned to the through-substrate via.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
   providing a base substrate, a carrier substrate, and a buried metallization layer intermediate the base substrate and the carrier substrate, and a top metallization layer of a first conductive metal material on a top surface of the carrier substrate;
   forming unfilled through-substrate-vias in the carrier substrate to the buried metallization layer;
   forming an under bump metallization layer of a second conductive metal material on surfaces defining the unfilled through-substrate-vias, a perimeter surrounding the unfilled through-substrate-vias on the carrier substrate, and on the first conductive metal material layer, wherein the under bump metallization layer is coupled to the buried metallization layer and the top metallization layer, and wherein the first and second conductive metal materials are different;
   depositing and patterning a sacrificial layer to form openings exposing the unfilled through-substrate-vias, the perimeter surrounding the unfilled through-substrate-vias on the carrier substrate, and on the top metallization layer;
   filling the openings with a third conductive metal material to form filled through-sub strate-vias; and
   removing the sacrificial layer to form cylindrical shaped solder bumps self-aligned to the filled through-substrate-vias.

2. The method of claim 1, wherein the filled through-substrate-vias have an aspect ratio relative to the carrier substrate of less than 10.

3. The method of claim 1, wherein the first and third conductive metal materials are the same.

4. The method of claim 1, further comprising reflowing the third conductive metal material to form hemispherical-shaped solder bumps self-aligned to a filled through-substrate-via.

5. The method of claim 1, wherein depositing the sacrificial layer comprises laminating a dry photoresist.

6. The method of claim 1, wherein forming the under bump metallization layer comprises depositing a dry photoresist over topography provided on the carrier substrate, patterning the dry photoresist so as to expose surfaces corresponding to the unfilled through-substrate-vias and at least a portion of the perimeter surrounding the unfilled through-substrate-vias on the carrier substrate and on the metallization layer, sputter depositing the second conductive metal material onto the exposed surfaces, and removing the dry photoresist with a lift off process.

7. The method of claim 1, wherein the first, second and third conductive metal material are superconducting metals.

8. The method of claim 1, wherein providing the base substrate bonded to the carrier substrate comprising the buried metallization layer intermediate the base substrate and the carrier substrate comprises applying a thermocompression bonding force and temperature to bond the base substrate and the carrier substrate, wherein each of the base substrate and the carrier substrate include a portion of buried metallization layer.

9. The method of claim 1, wherein filling the openings with the third conductive metal material comprises an injection molding soldering process or an electroplating process.

10. The method of claim 1, wherein the carrier substrate has a thickness defining a length dimension of the through-substrate-via.

11. The method of claim 10, further comprising thinning the carrier substrate to define the thickness prior to forming unfilled through-substrate-vias.

\* \* \* \* \*